United States Patent
Kuroki et al.

(10) Patent No.: US 7,719,921 B2
(45) Date of Patent: May 18, 2010

(54) DUTY DETECTION CIRCUIT, DLL CIRCUIT USING THE SAME, SEMICONDUCTOR MEMORY CIRCUIT, AND DATA PROCESSING SYSTEM

(75) Inventors: Koji Kuroki, Tokyo (JP); Yasuhiro Takai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 95 days.

(21) Appl. No.: 12/170,730

(22) Filed: Jul. 10, 2008

(65) Prior Publication Data

US 2009/0016127 A1     Jan. 15, 2009

(30) Foreign Application Priority Data

Jul. 10, 2007   (JP)   ............... 2007-181358

(51) Int. Cl.
    *G11C 11/00*   (2006.01)
(52) U.S. Cl. .................... 365/233.1; 365/194
(58) Field of Classification Search .............. 365/233.1, 365/194
    See application file for complete search history.

(56) References Cited

U.S. PATENT DOCUMENTS

| | | | |
|---|---|---|---|
| 6,101,152 A * | 8/2000 | Farmwald et al. ........... 365/194 |
| 6,166,989 A * | 12/2000 | Hamamoto et al. ........... 365/51 |
| 6,243,320 B1 * | 6/2001 | Hamamoto et al. ..... 365/230.08 |
| 6,262,921 B1 * | 7/2001 | Manning ................... 365/194 |
| 6,490,207 B2 * | 12/2002 | Manning ................... 365/194 |
| 6,751,120 B2 * | 6/2004 | Miwa et al. ............ 365/185.03 |
| 6,757,194 B2 * | 6/2004 | Miwa et al. ............ 365/185.03 |
| 6,906,952 B2 * | 6/2005 | Yoshida et al. ......... 365/185.03 |
| 6,947,350 B2 * | 9/2005 | Winograd et al. ........ 365/233.1 |
| 7,110,322 B2 * | 9/2006 | Farmwald et al. ....... 365/189.15 |
| 7,180,790 B2 * | 2/2007 | Jeong et al. ............. 365/233.1 |
| 7,251,162 B2 * | 7/2007 | Kawajiri et al. ........ 365/185.18 |
| 7,286,397 B2 * | 10/2007 | Miwa et al. ............ 365/185.03 |
| 7,388,768 B2 * | 6/2008 | Hanzawa et al. ......... 365/233.1 |
| 7,471,569 B2 * | 12/2008 | Hummler ............... 365/185.25 |
| 7,489,580 B2 * | 2/2009 | Ito et al. ..................... 365/222 |

FOREIGN PATENT DOCUMENTS

| | | | |
|---|---|---|---|
| JP | 2006-303553 A | 11/2006 |
| JP | 2007-121114 A | 5/2007 |

* cited by examiner

*Primary Examiner*—Michael T Tran
(74) *Attorney, Agent, or Firm*—Sughrue Mion, PLLC

(57) ABSTRACT

A duty detection circuit includes discharge transistors, charge transistors, detection lines, and a comparator circuit that detects a potential difference of these detection lines, and also includes a gate circuit that controls the discharge transistors and the charge transistors in response to the internal clock signal of an even cycle. As a result, the detection lines are charged and discharged in response to the internal clock signal of the even cycle. Consequently, the duty detection circuit can be applied to a multi-phase DLL circuit, and a potential difference appearing in the detection line can be sufficiently secured.

18 Claims, 12 Drawing Sheets

US 7,719,921 B2

DUTY DETECTION CIRCUIT, DLL CIRCUIT USING THE SAME, SEMICONDUCTOR MEMORY CIRCUIT, AND DATA PROCESSING SYSTEM

TECHNICAL FIELD

The present invention relates to a duty detection circuit and a DLL circuit using the same, and, more particularly relates to a duty detection circuit suitable for detecting a duty of an internal clock signal used in a DDR (Double Data Rate) synchronous DRAM, and a DLL circuit using the circuit. The present invention also relates to a semiconductor memory device using the DLL circuit, and a data processing system using the semiconductor memory device.

BACKGROUND OF THE INVENTION

In the DDL synchronous DRAM, a DLL (Delay Locked Loop) circuit is used to synchronize data input-and-output timings with an external clock signal. In many cases, the DLL circuit is provided with a duty detection circuit so that a duty of the internal clock signal becomes 50% (see Japanese Patent Application Laid-open No. 2006-303553).

FIG. 9 is a circuit diagram of a conventional duty detection circuit.

The duty detection circuit shown in FIG. 9 includes a detection line LDUTYHB connected to a contact node between a discharge transistor TR1 and a charge transistor TR3, a detection line LDUTYLB connected to a contact node between a discharge transistor TR2 and a charge transistor TR4, and a comparator circuit COMP that detects a potential difference of these detection lines LDUTYHB and LDUTYLB. Capacitances C1 and C2 are connected to the detection line LDUTYHB, and capacitances C3 and C4 are connected to the detection line LDUTYLB.

The discharge transistor TR1 and the charge transistor TR3 are controlled by gate circuits G1 and G3, respectively, and are brought into on state in response to an internal clock signal LCLKOET and a selection signal LDCSMT, respectively. On the other hand, the discharge transistor TR2 and the charge transistor TR4 are controlled by gate circuits G2 and G4, respectively, and are brought into on state in response to an internal clock signal LCLKOEB and a selection signal LDCSMB, respectively. The internal clock signal LCLKOET and the internal clock signal LCLKOEB are internal clock signals for duty detection, and are mutually complementary signals.

Sources of the discharge transistors TR1 and TR2 are connected in common to a discharge node BIASND. The discharge node BIASND is connected to a ground potential via a bias transistor N1. On the other hand, a precharge circuit P0 operating based on a precharge signal PRE is connected to the charge transistors TR3 and TR4.

FIG. 10 is an operation waveform diagram of the duty detection circuit shown in FIG. 9.

As shown in FIG. 10, the selection signal LDCSMT is activated during a period of a clock edge 0 to a clock edge 4, and the selection signal LDCSMB is activated during a period of a clock edge 1 to a clock edge 5. That is, these selection signals are activated with a half cycle deviation of the internal clock signal.

Based on the above, the detection line LDUTYHB is discharged when the internal clock signal LCLKOET becomes at a high level and is charged when the internal clock signal LCLKOET becomes at a low level, during a period while the selection signal LDCSMT is activated. Similarly, the detection line LDUTYLB is discharged when the internal clock signal LCLKOEB becomes at a high level and is charged when the internal clock signal LCLKOEB becomes at a low level, during a period while the selection signal LDCSMB is activated.

As a result, when the duty of the internal clock signal LCLKOET is large, the potential of the detection line LDUTYHB becomes low, and the potential of the detection line LDUTYLB becomes high. On the other hand, when the duty of the internal clock signal LCLKOET is small, the potential of the detection line LDUTYHB becomes high, and the potential of the detection line LDUTYLB becomes low. The comparator circuit COMP detects a potential difference $\Delta V$ obtained in this way, and generates a duty detection signal LUPDCT.

However, the conventional duty detection circuit shown in FIG. 9 has a problem in that discharge speeds of the discharge transistors TR1 and TR2 are different at the detection starting time. That is, while the discharge transistor TR1 is turned on at the clock edge 0, both the discharge transistors TR1 and TR2 are off during a preceding period. Therefore, a discharge node BIASND at the detection starting time is substantially at a ground potential. On the other hand, because the discharge transistor TR2 is turned on at the clock edge 1, the discharge node BIASND already increases at the detection starting time. Consequently, a difference occurs between the discharge speeds of the discharge transistors TR1 and TR2, and an accurate detection of duty cannot be performed.

Further, the conventional duty detection circuit shown in FIG. 9 has continuous two cycles as a detection period. Therefore, only an average value of the duty in an even cycle and the duty in an odd cycle can be obtained. For example, when the duty in the even cycle is 60% and when the duty of the odd cycle is 40%, the average value becomes 50%. As a result, duty correction is not performed.

When a so-called "two-phase DLL circuit" is used, the duty in the even cycle is different from the duty in the odd cycle. The two-phase DLL is a system that generates two frequency-divided signals by dividing an external clock signal into two, and generates an internal clock signal by combining the two frequency-divided signals after adjusting a delay amount of the frequency-divided signals. This type of DLL circuit is often used when the frequency of the external clock signal is high.

However, according to the two-phase DLL circuit, because the control of the internal clock signal in the even cycle is independent of the control of the internal clock signal in the odd cycle, the duty in the even cycle does not coincide with the duty in the odd cycle is some cases. In this case, the duty detection circuit shown in FIG. 9 cannot perform accurate detection.

As a method of solving the above problems, the present inventors have proposed an improved duty detection circuit in the past (see Japanese Patent Application Laid-open No. 2007-121114).

FIG. 11 is a circuit diagram of the improved duty detection circuit.

The duty detection circuit shown in FIG. 11 additionally includes a delay circuit D1 that delays the output of the gate circuit G2 while deleting the charge transistors TR3 and TR4 and the gate circuits G3 and G4 that control these charge transistors, in the duty detection circuit shown in FIG. 9.

FIG. 12 is an operation waveform diagram of the duty detection circuit shown in FIG. 11.

As shown in FIG. 12, in the present example, the selection signal LDCSMT is activated by dividing the period into a period of the clock edges 0 to 2 and a period of the clock edges 4 to 6, and the selection signal LDCSMB is activated by dividing the period into a period of the clock edges 1 to 3 and a period of the clock edges 5 to 7. As a result, the selection signal as an output of the gate circuits G1 and G2 has a waveform corresponding to only the even cycle of the internal clock signal.

Therefore, the duty detection circuit shown in FIG. 11 can detect a duty by extracting only the duty in the even cycle (or the odd cycle). Consequently, by providing the duty detection circuit for the even cycle and the duty detection circuit for the odd cycle, these duty detection circuits can be applied to the two-phase DLL circuit.

Further, because the output of the gate circuit G2 can be supplied to the discharge transistor TR2 after being delayed by the delay circuit D1, a period during which both transistors are turned off are inserted into between the on period of the discharge transistor TR1 and the on period of the discharge transistor TR2. Consequently, when the discharge transistors TR1 and TR2 change from off to on, the potential of the discharge node BIASND is precharged to about a ground potential, and there arises no difference in discharge speeds.

However, because the charge transistors TR3 and TR4 are omitted in the duty detection circuit shown in FIG. 11, the potential difference ΔV appearing in the detection lines LDU-TYHB and LDUTYLB is smaller than that in the duty detection circuit shown in FIG. 9. This problem is considered to be solved by adding the charge transistors TR3 and TR4 to the duty detection circuit shown in FIG. 11. However, when only the charge transistors TR3 and TR4 are added, other problems occur such as a variation between the control at the charge side and the control at the discharge side, and a variation between the control at the detection line LDUTYHB side and the control at the detection line LDUTYLB side.

SUMMARY OF THE INVENTION

It is therefore an object of the present invention to provide a duty detection circuit that can be applied to a multi-phase DLL circuit, can hold the discharge speed and the charge speed at a constant level, and can have a large potential difference appearing in the detection line, and a DLL circuit using the duty detection circuit.

Another object of the present invention is to provide a semiconductor memory device using the DLL circuit.

Still another object of the present invention is to provide a data processing system using the semiconductor memory device.

A duty detection circuit according to the present invention comprises:

first and second discharge transistors that operate in response to first and second control signals;

first and second charge transistors that operate in response to third and fourth control signals;

a first detection line connected to a contact node between the first discharge transistor and the first charge transistor;

a second detection line connected to a contact node between the second discharge transistor and the second charge transistor;

a comparator circuit that detects a potential difference between the first and second detection lines;

a first gate circuit that can activate the first control signal when an internal clock signal being at a high level during every n cycles (where n is a power of 2) of an internal clock signal;

a second gate circuit that can activate the second control signal when the internal clock signal being at a low level during every n cycles of the internal clock signal;

a third gate circuit that can activate the third control signal when the internal clock signal being at the low level during every n cycles of the internal clock signal;

a fourth gate circuit that can activate the fourth control signal when the internal clock signal being at the high level during every n cycles of the internal clock signal;

a first delay circuit that delays one of the first and second control signals; and a second delay circuit that delays one of the third and fourth control signals.

A DLL circuit according to the present invention comprises:

a frequency-dividing circuit that generates n (where n is a power of 2) frequency-divided signals of which phases are mutually different, by dividing the frequency of an external clock signal into n;

n delay adjusting units that adjust the phases of the frequency-divided signals;

a combining circuit that generates an internal clock signal by combining outputs from the n delay adjusting units; and the duty detection circuit having above described configuration that detects a duty of the internal clock signal, and an output signal of the duty detection circuit is fed back to at least one of the n delay adjusting units.

A semiconductor memory device according to the present invention includes said DLL circuit. A data processing system according to the present invention includes said semiconductor memory device.

According to the present invention, the first and second detection lines are charged and discharged corresponding to the internal clock signal of an n-time cycle. Therefore, the duty detection circuit can be applied to the multi-phase DLL circuit, and a potential difference appearing in the detection line can be sufficiently secured. Further, a delay circuit is provided at not only the discharge side but also the charge side. Therefore, the discharge speed and the charge speed can be also secured at a constant level.

It is preferable that the first gate circuit receives the internal clock signal and a first selection signal, and generates the first control signal, the second gate circuit receives an inverted signal of the internal clock signal and a second selection signal, and generates the second control signal, the third gate circuit receives the inverted signal and a third selection signal, and generates the third control signal, and the fourth gate circuit receives the internal clock signal and a fourth selection signal, and generates the fourth control signal. According to this configuration, the number of stages of each gate circuit can be minimized.

It is more preferable that the numbers of the first to fourth control signals that active corresponding each detection period are mutually equal. According to this configuration, the detection variation can be minimized.

According to the present invention, it is possible to provide a duty detection circuit that can be applied to the multi-phase DLL circuit, can hold the discharge speed and the charge speed at a constant level, and can have a large potential difference appearing in the detection line. Further, it is possible to provide a DLL circuit and a semiconductor memory device using the duty detection circuit.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
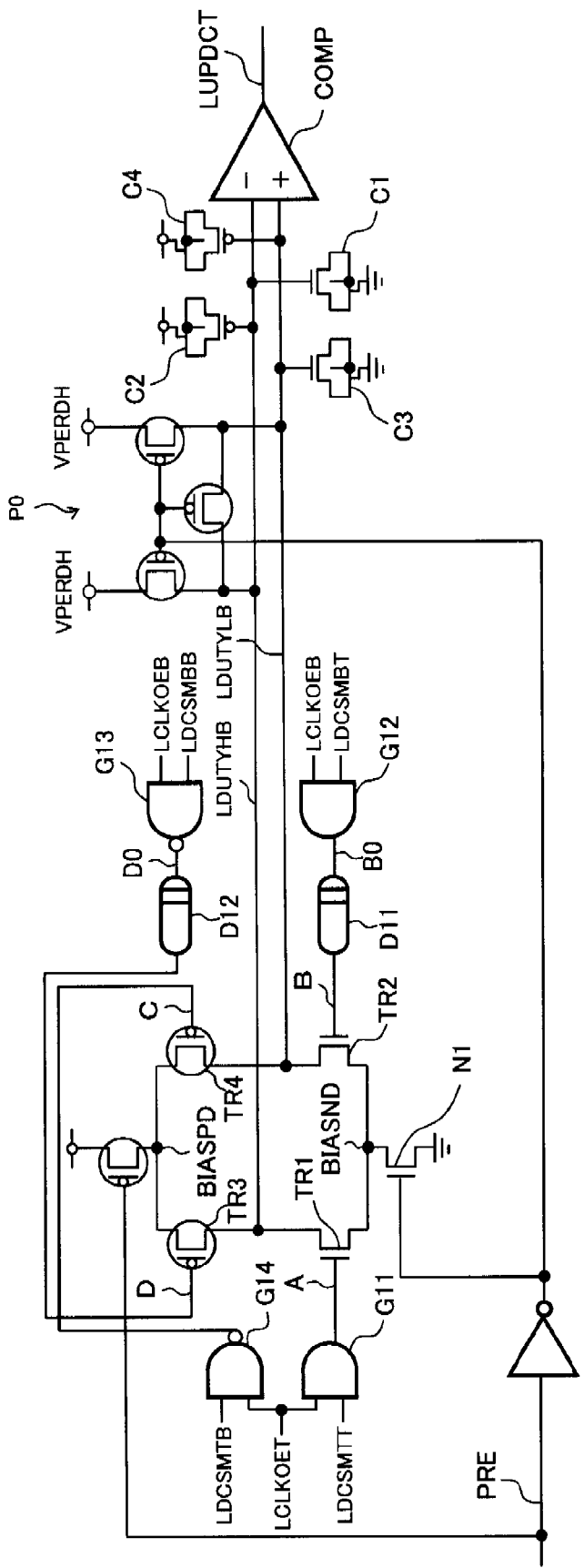
FIG. 1 is a circuit diagram of a duty detection circuit according to a preferred embodiment of the present invention.

FIG. 1 is a circuit diagram of a duty detection circuit according to a preferred embodiment of the present invention.

As shown in FIG. 1, the duty detection circuit according to the present embodiment includes the discharge transistors TR1 and TR2 that are turned on in response to control signals A and B, respectively, the charge transistors TR3 and TR4 that are turned on in response to control signals D and C, respectively, the detection line LDUTYHB connected to a contact node between the discharge transistor TR1 and the charge transistor TR3, the detection line LDUTYLB connected to a contact node between the discharge transistor TR2 and the charge transistor TR4, and the comparator circuit COMP that detects a potential difference of these detection lines LDUTYHB and LDUTYLB. The capacitances C1 and C2 are connected to the detection line LDUTYHB, and the capacitances C3 and C4 are connected to the detection line LDUTYLB.

The transistors TR1 to TR4 are controlled by gate circuits G11 to G14, respectively. The gate circuit G11 is an AND gate that receives the internal clock signal LCLKOET and a selection signal LDCSMTT. When these signals are brought into a high level, a control signal A is activated. The gate circuit G12 is an AND gate that receives the internal clock signal LCLKOEB and a selection signal LDCSMBT. When these signals are brought into a high level, a control signal B0 is activated. The gate circuit G13 is a NAND gate that receives the internal clock signal LCLKOEB and a selection signal LDCSMBB. When these signals are brought into a high level, a control signal D0 is activated. The gate circuit G14 is a NAND gate that receives the internal clock signal LCLKOET and a selection signal LDCSMTB. When these signals are brought into a high level, a control signal C is activated.

As is well known, in a semiconductor integrated circuit, an AND gate includes a combination of a NAND gate and an inverter. Therefore, the discharge transistors TR1 and TR2 are controlled respectively by a signal passing through a two-stage logic circuit. On the other hand, the charge transistors TR3 and TR4 are controlled respectively by a signal passing through a one-stage logic circuit. As explained above, according to the circuit configuration of the present embodiment, the number of stages of each gate circuit can be minimized, signal paths controlling the discharge transistors TR1 and TR2 are balanced, and signal paths controlling the discharge transistors TR3 and TR4 are balanced. Therefore, a satisfactory circuit characteristic can be obtained.

As shown in FIG. 1, the control signals A and C are supplied directly to the gate circuits G11 and G14. On the other hand, the control signals B0 and D0 are supplied to the gate circuits G12 and G13 after being passed through delay circuits D11 and D12, respectively. The signals passing through the delay circuits D11 and D12 are denoted as control signals B and D. Delay amounts of the delay circuits D11 and D12 are set to at least a half cycle of the internal clock signal.

Sources of the discharge transistors TR1 and TR2 are connected in common to the discharge node BIASND. The discharge node BIASND is connected to the ground potential via the bias transistor N1. Similarly, sources of the charge transistors TR3 and TR4 are connected in common to the charge node BIASPD. The charge node BIASPD is connected to the power source potential via the bias transistor P1. As shown in FIG. 1, the precharge signal PRE is supplied to the gate of the bias transistor P1, and an inverted signal of the precharge signal PRE is supplied to the gate of the bias transistor N1.

The precharge circuit P0 is connected to the detection lines LDUTYHB and LDUTYLB. The precharge circuit P0 precharges the detection lines LDUTYHB and LDUTYLB to an intermediate potential VPERDH, and is activated in response to the precharge signal PRE. The intermediate potential VPERDH is a potential between the ground potential and the power source potential, and is preferably a half potential of the power source potential.

Figure 11:
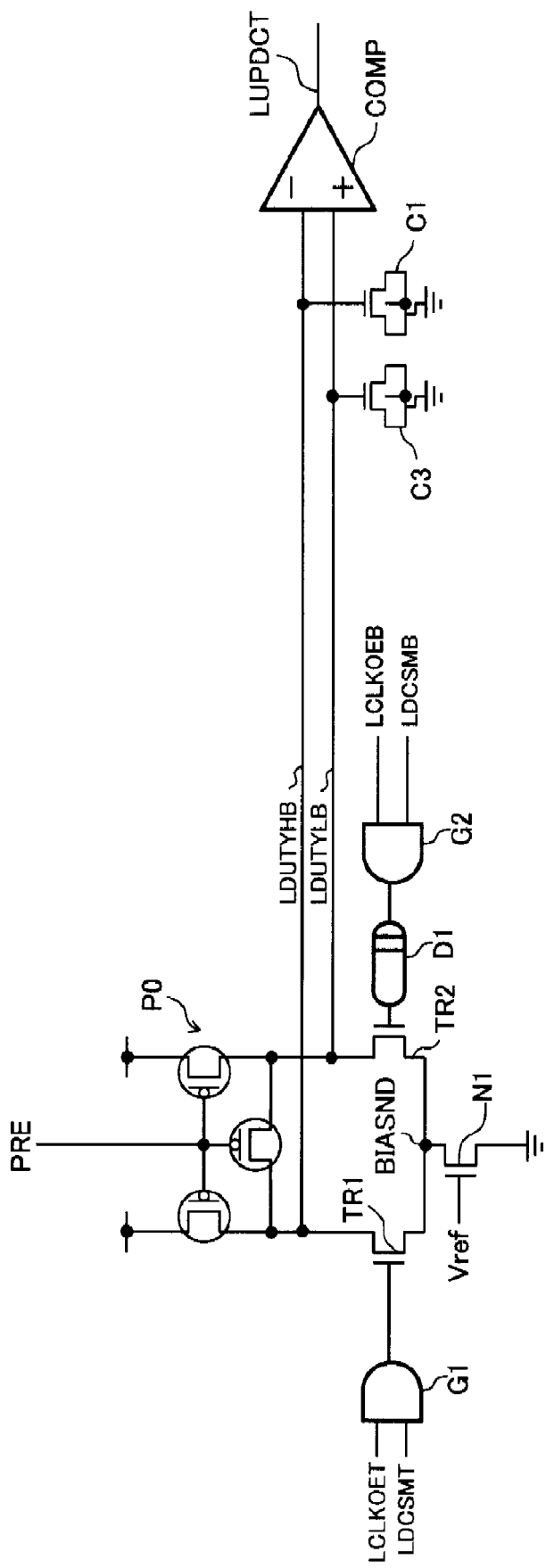
FIG. 11 is a circuit diagram of the improved duty detection circuit.
Figure 12:
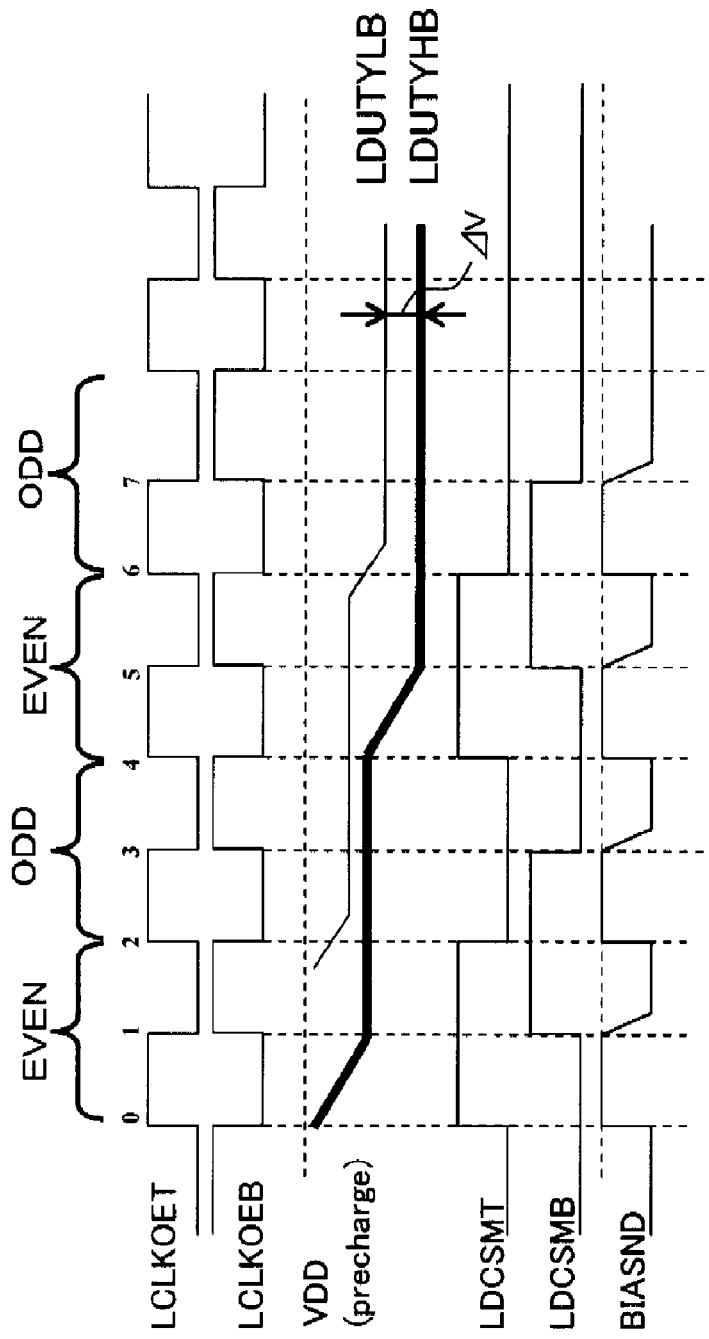
FIG. 12 is an operation waveform diagram of the duty detection circuit shown in FIG. 11.

As explained above, the duty detection circuit according to the present embodiment includes not only the discharge transistors but also the charge transistors. Therefore, as compared with the conventional duty detection circuit shown in FIG. 11, a potential difference generated in the detection lines LDUTYHB and LDUTYLB can be enlarged.

Figure 2:
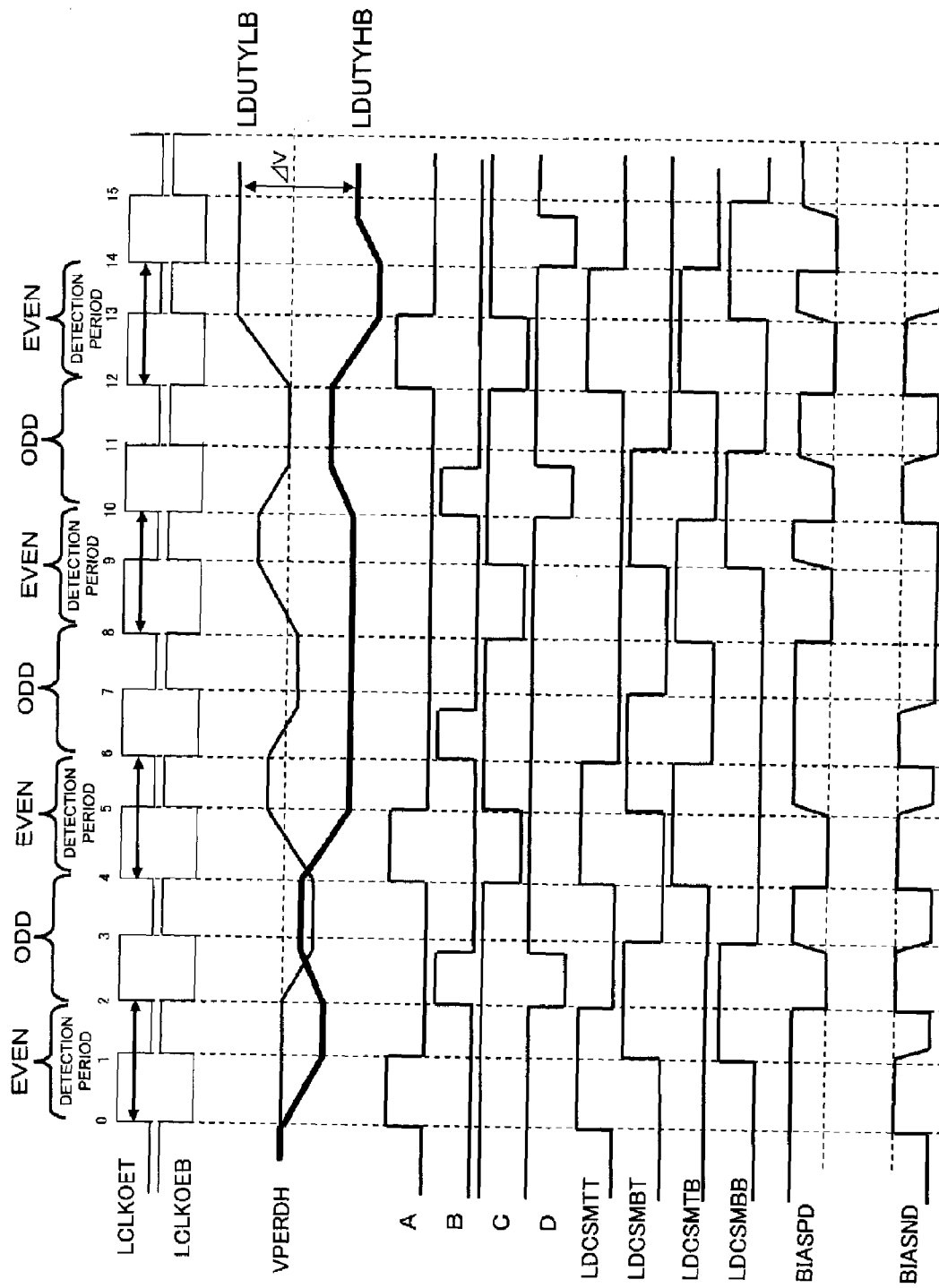
FIG. 2 is an operation waveform diagram of the duty detection circuit shown in FIG. 1.

FIG. 2 is an operation waveform diagram of the duty detection circuit shown in FIG. 1.

As shown in FIG. 2, the selection signal LDCSMTT is activated at three times during a period of the clock edges 0 to 2, a period of the clock edges 4 to 6, and a period of the clock edges 12 to 14. The selection signal LDCSMBT is activated at three times during a period of the clock edges 1 to 3, a period of the clock edges 5 to 7, and a period of the clock edges 9 to 11. The selection signal LDCSMBB is activated at three times during a period of the clock edges 1 to 3, a period of the clock edges 9 to 11, and a period of the clock edges 13 to 15. As a result, the control signals A to D as the outputs of the gate circuits G11 to G14 have waveforms corresponding to only the even cycles of the internal clock signal.

Therefore, the duty detection circuit according to the present embodiment can extract and detect only a duty in the even cycle (or the odd cycle). Consequently, the duty detection circuit can be applied to the two-phase DLL circuit by providing a duty detection circuit for the even cycle and a duty detection circuit for the odd cycle.

Further, the output of the gate circuit G12 is supplied to the discharge transistor TR2 after being delayed by the delay circuit D11. Therefore, a period during which both the discharge transistor TR1 and the discharge transistor TR2 are turned off is inserted into between the on period of the discharge transistor TR1 and the on period of the discharge transistor TR2, by only the amount delayed by the delay circuit D11. Consequently, when the discharge transistors TR1 and TR2 change from off to on, the potential of the discharge node BIASND is substantially precharged to the ground potential, and no difference occurs in the discharge speed.

Similarly, the output of the gate circuit G13 is supplied to the charge transistor TR3 after being delayed by the delay circuit D12. Therefore, a period during which both the charge transistor TR3 and the charge transistor TR4 are turned off is inserted into between the on period of the charge transistor TR3 and the on period of the charge transistor TR4, by only the amount delayed by the delay circuit D12. Consequently, when the charge transistors TR3 and TR4 change from off to on, the potential of the charge node BIASPD is substantially precharged to the power source potential, and no difference occurs in the charge speed.

Figure 3:
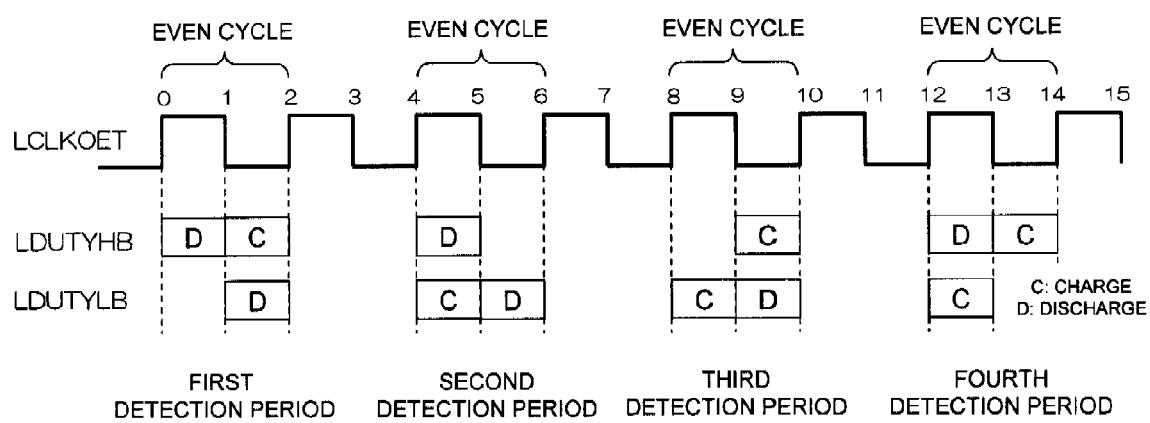
FIG. 3 is a schematic timing diagram for explaining the charge and discharge operations performed during detection periods.

FIG. 3 is a schematic timing diagram for explaining the charge and discharge operations performed during detection periods.

As shown in FIG. 3, the period of the clock edges 0 to 2 corresponds to a first detection period, and the control signals A, B, and D are activated corresponding to this period. As a result, charge and discharge of the detection line LDUTYHB and discharge of the detection line LDUTYLB are performed.

The period of the clock edges 4 to 6 corresponds to a second detection period, and the control signals A, B, and C are activated corresponding to this period. As a result, discharge of the detection line LDUTYHB and charge and discharge of the detection line LDUTYLB are performed.

The period of the clock edges 8 to 10 corresponds to a third detection period, and the control signals B, C, and D are activated corresponding to this period. As a result, charge of the detection line LDUTYHB and charge and discharge of the detection line LDUTYLB are performed.

The period of the clock edges 12 to 14 corresponds to a fourth detection period, and the control signals A, C, and D are activated corresponding to this period. As a result, charge and discharge of the detection line LDUTYHB and charge of the detection line LDUTYLB are performed.

Because there are three control signals to be activated corresponding to each detection cycle, detection variation can be minimized. That is, when there is a variation in the number of control signals to be activated corresponding to each detection cycle, a difference occurs between the charge and discharge conditions of the detection line LDUTYHB and the charge and discharge conditions of the detection line LDUTYLB. However, when the number of control signals to be activated corresponding to each detection cycle is constant, the difference of conditions can be substantially avoided. Further, the time necessary for the detection can be shortened from the time when the number of control signals to be activated corresponding to each detection cycle is one or two.

As explained above, the charge and discharge pattern according to the present embodiment has no unbalance between the control at the charge side and the control at the discharge side, and has no unbalance between the control at the detection line LDUTYHB side and the control at the detection line LDUTYLB side. Therefore, duty detection can be performed in very high precision.

Figure 4:
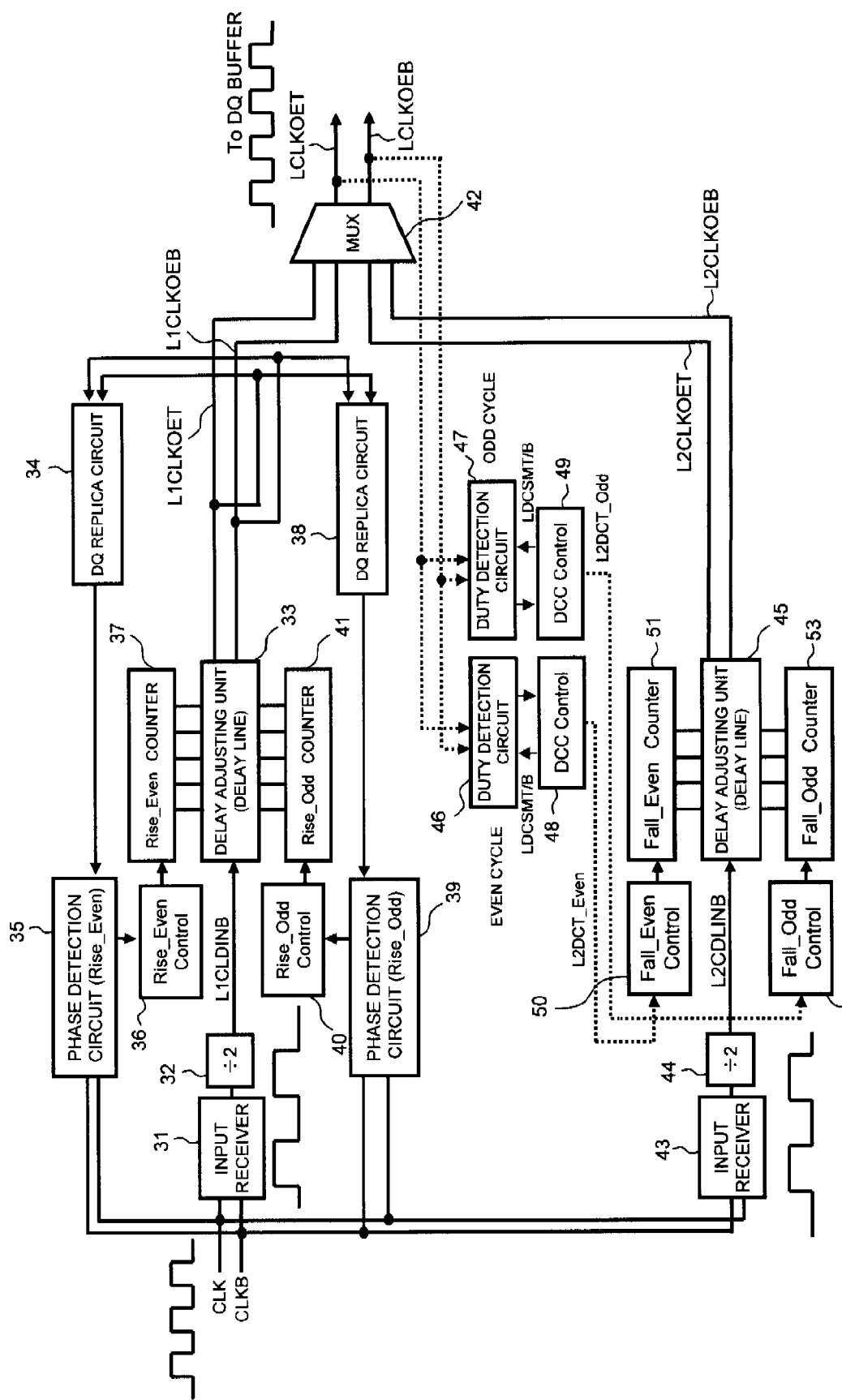
FIG. 4 is a block diagram of a DLL circuit using the duty detection circuit shown in FIG. 1.

FIG. 4 is a block diagram of a DLL circuit using the duty detection circuit according to the present embodiment.

The DLL circuit shown in FIG. 4 is a circuit used in a DDR synchronous DRAM as a semiconductor memory device, for example. An input external clock signal CLK is input to the DLL circuit via an input receiver 31 exclusive for the DLL circuit. A clock input from the input receiver 31 is frequency-divided synchronously with a rising edge by a frequency-dividing circuit 32. As a result, a frequency-divided clock signal L1CLDINB is generated. Similarly, a clock input from an input receiver 43 exclusive for the DLL circuit is divided synchronously with a falling edge (a rising edge of an inverted clock signal CLKB) by a frequency-dividing circuit 44. As a result, a frequency-divided clock signal L2CLDINB is generated. The frequency-divided internal clock signals L1CLDINB and L2CLDINB are input to their respective delay adjusting units (delay lines) 33 and 45.

The delay line 33 receives the frequency-divided internal clock signal L1CLDINB, delays this by a predetermined amount, and generates internal clock signals L1CLKOET/B. The internal clock signals L1CLKOET/B are input to DQ replica circuits 34 and 38 that perform the same operations as those of the DQ buffer that outputs data. The outputs of the DQ replica circuits 34 and 38 are supplied to phase detection circuits 35 and 39, and their phases are compared with a phase of the external clock signal CLK. A result of the phase comparison is fed back to the delay line 33, and a delay amount of the delay line 33 is adjusted so that the outputs of the DQ replica circuits 34 and 38 are synchronous with the rise of the external clock signal CLK.

The phase detection circuit 35 detects a phase of the rising edge of the external clock signal CLK in the even cycle, and inputs a detected result to a Rise_Even counter 37 via a Rise_Even controller 36. In response to this, the Rise_Even counter 37 adjusts a phase of the rising edge of the frequency-divided clock signal L1CLDINB. On the other hand, the phase detection circuit 39 detects a phase of the rising edge of the external clock signal CLK in the odd cycle, and inputs a detected result to a Rise_Odd counter 41 via a Rise_Odd controller 40. In response to this, the Rise_Odd counter 41 adjusts a phase of the rising edge of the frequency-divided clock signal L1CLDINB. As explained above, in the delay line 33, both phases of the rising edge and the falling edge of the frequency-divided clock signal are adjusted.

On the other hand, the delay amount of the delay line 45 to which the frequency-divided clock signal L2CLDINB is input is adjusted so that the duty of the output data from the DQ buffer becomes 50%. The delay line 45 receives the frequency-divided internal clock signal L2CLDINB, delays this by a predetermined amount, and generates internal clock signals L2CLKOET/B.

L1CLKOET/B as the output of the delay line 33 and L2CLKOET/B as the output of the delay line 4 are combined by the multiplexer 42, and the internal clock signals LCLKOET/B are generated. The internal clock signals LCLKOET/B are supplied to duty detection circuits 46 and 47. Based on a result of the determination, a delay amount of the delay line 45 is adjusted.

As explained above, the rising edges of the generated internal clock signals LCLKOET/B are adjusted by the delay line 33, and the falling edges are adjusted by the delay line 45. Clock signals LCKOET/B after the adjustment are supplied to the DQ buffer unit. As a result, the timings of the data output by the DQ buffer are synchronized with the external clock signal CLK.

As shown in FIG. 4, the duty detection circuit 46 is that for the even cycle, and the duty detection circuit 47 is that for the odd cycle. The duty detection circuit 46 for the even cycle receives the internal clock signals LCLKOET/B, and the selection signals LDCSMTT to LDCSMBB from a DCC controller 48, and detects the duty of the internal clock signal in the even cycle, based on this. Detailed operations are as explained above.

The determination signal L2DCT_Even as the output of the DCC controller 48 is supplied to a Fall_Even counter 51 via the Fall_Even controller 50. In response to this, the Fall_Even counter 51 adjusts the phase of the rising edge of the frequency-divided clock signal L2CLDINB. As a result, the duties of the internal clock signals LCLKOET/B in the even cycle are corrected to 50%.

Similarly, the duty detection circuit 47 for the odd cycle receives the internal clock signals LCLKOET/B and the selection signals LDCSMTT to LDCSMBB from a DCC controller 49, and detects the duty of the internal clock signal in the odd cycle based on this. The determination signal L2DCT_Odd as the output of the DCC controller 49 is supplied to a Fall_Odd counter 53 via a Fall_Odd controller 52. In response to this, the Fall_Odd counter 53 adjusts the phase of the falling edge of the frequency-divided clock signal L2CLDINB. As a result, the duties of the internal clock signals LCLKOET/B in the odd cycle are also corrected to 50%.

The configuration of the DLL circuit according to the present embodiment is as described above. By using the two duty detection circuits, the duty in the even cycle and the duty in the odd cycle can be adjusted to 50%, respectively.

The above DLL circuit can be used for the DDR synchronous DRAM as described above.

Figure 5:
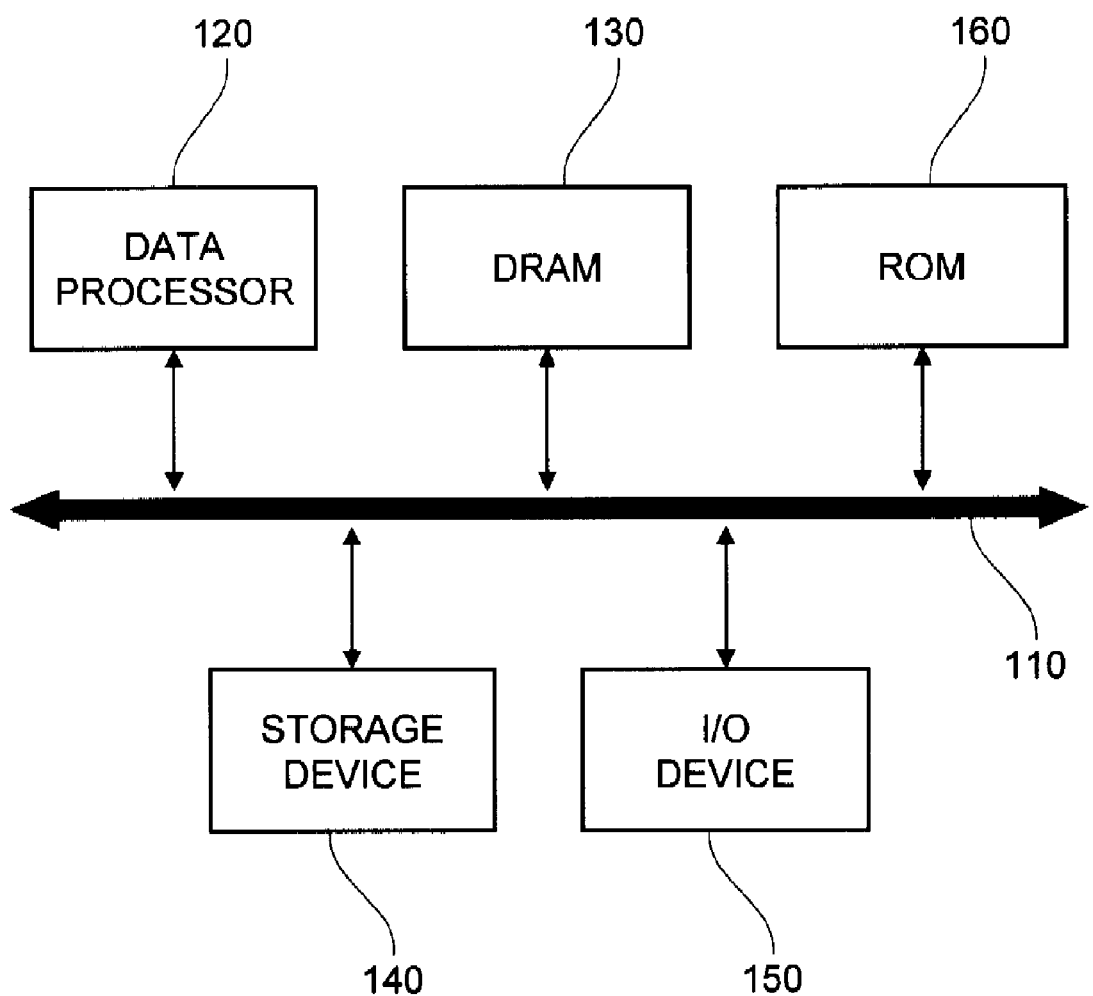
FIG. 5 is a block diagram showing a configuration of a data processing system using a semiconductor memory device according to a preferred embodiment of the present invention.

FIG. 5 is a block diagram showing a configuration of a data processing system 100 using a semiconductor memory device according to a preferred embodiment of the present invention. The semiconductor memory device according to the present embodiment is a DRAM.

The data processing system 100 shown in FIG. 5 includes a data processor 120 and a semiconductor memory device (DRAM) 130 according to the present embodiment connected to each other via a system bus 110. The data processor 120 includes a microprocessor (MPU) and a digital signal processor (DSP), for example. However, the constituent elements of the data processor 120 are not limited to these. In FIG. 5, while the data processor 120 and the DRAM 130 are connected to each other via the system bus 110, to simplify the explanation, the data processor 120 and the DRAM 130 can be connected to each other via a local bus without via the system bus 110.

While only one set of the system bus 110 is drawn to simplify the explanation in FIG. 5, the system bus can be set in series or in parallel via the connector according to need. In the memory system data processing system shown in FIG. 5, a storage device 140, an I/O device 150, and a ROM 160 are connected to the system bus 110. However, these are not necessarily essential constituent elements of the invention.

The storage device 140 includes a hard disk drive, an optical disk drive, and a flash memory. The I/O device 150 includes a display device such as a liquid-crystal display, and an input device such as a keyboard and a mouse. The I/O device 150 may be any one of the input device and the output device. Further, while each one constituent element is drawn in FIG. 5 to simplify the explanation, the number of each constituent element is not limited to one, and may be one or two or more.

The present invention is in no way limited to the aforementioned embodiments, but rather various modifications are possible within the scope of the invention as recited in the claims, and naturally these modifications are included within the scope of the invention.

Figure 6:
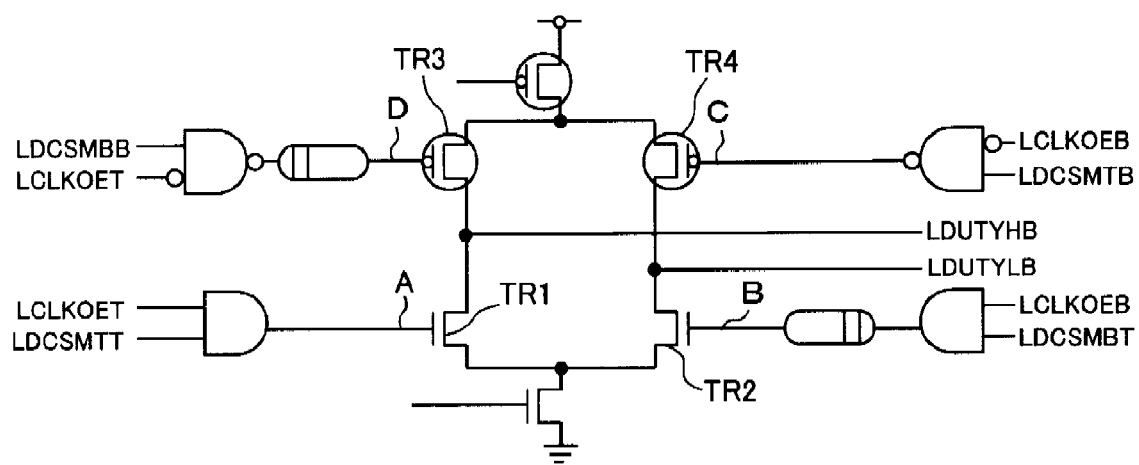
FIG. 6 is a circuit diagram of a duty detection circuit according to a modified embodiment of the present invention.
Figure 7:
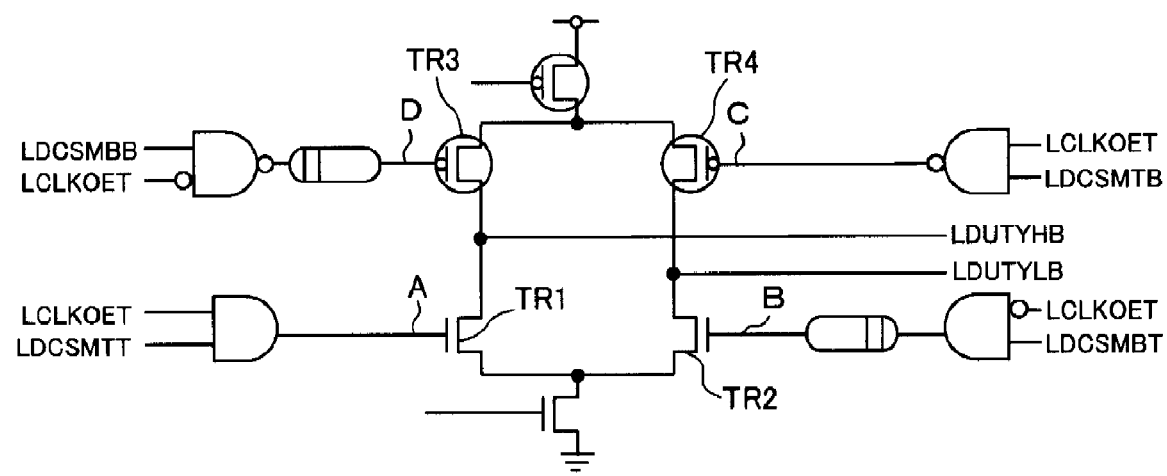
FIG. 7 is a circuit diagram of a duty detection circuit according to another modified embodiment of the present invention.
Figure 8:
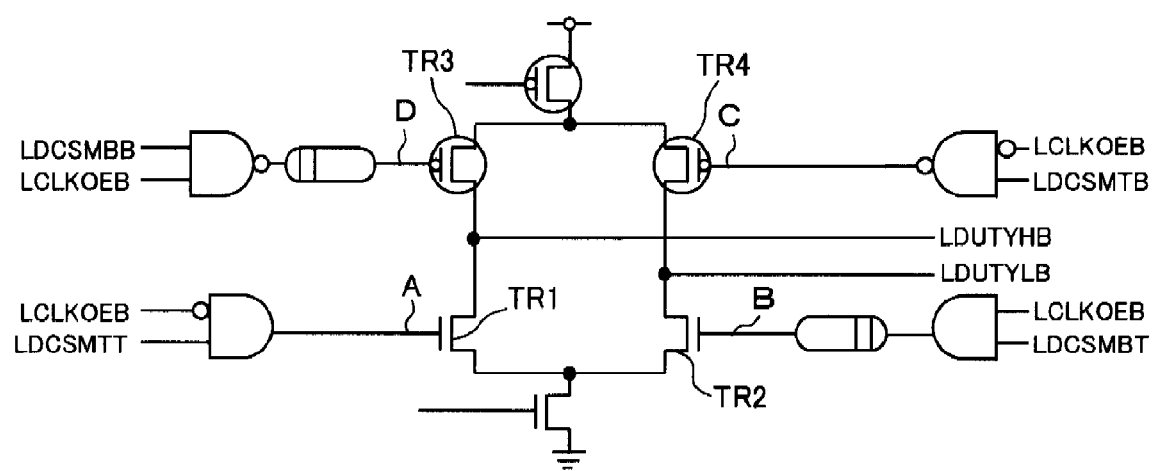
FIG. 8 is a circuit diagram of a duty detection circuit according to still another modified embodiment of the present invention.
Figure 9:
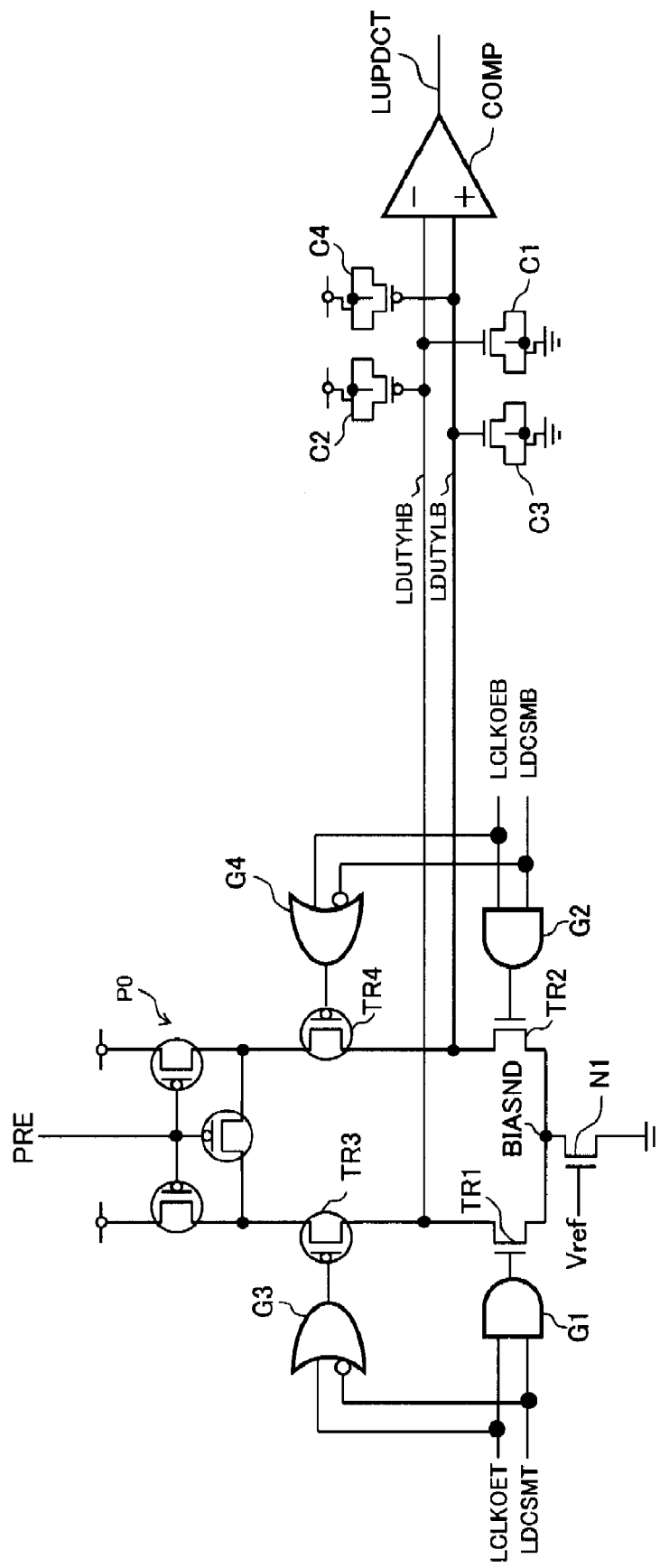
FIG. 9 is a circuit diagram of a conventional duty detection circuit.
Figure 10:
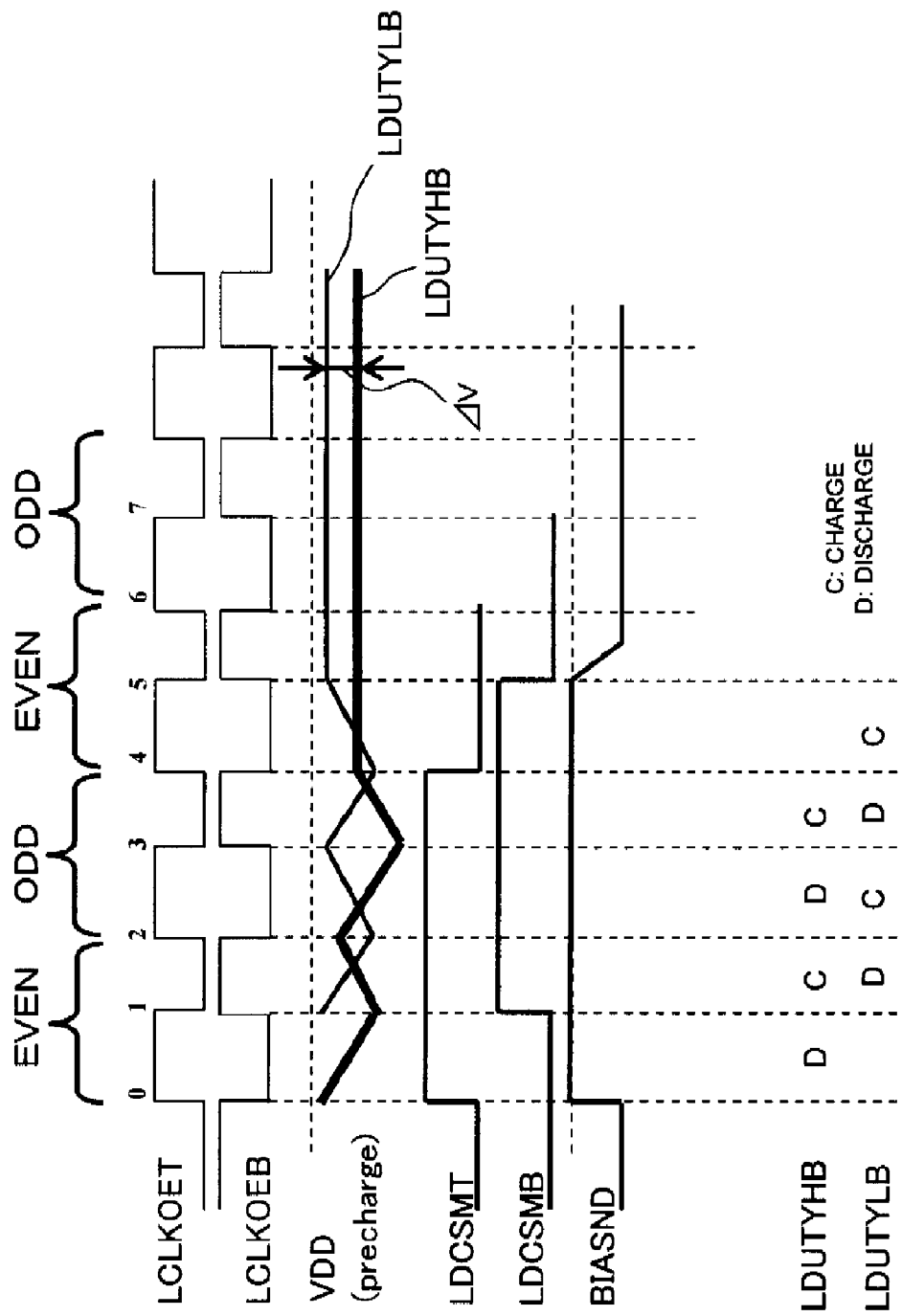
FIG. 10 is an operation waveform diagram of the duty detection circuit shown in FIG. 9.

For example, the logic of the gate circuit that generates the control signals A to D is not limited to that shown in FIG. 1, and various changes can be performed. Circuits shown in FIG. 6 to FIG. 8 can be taken up as modifications. The circuits shown in FIG. 6 to FIG. 8 perform the same operation as that of the circuit shown in FIG. 1. However, the circuits shown in FIG. 6 to FIG. 8 increase the number of gate stages from that of the circuit shown in FIG. 1 and generate unbalance in the number of gate stages. Therefore, it is most preferable that the circuit shown in FIG. 1 is used.

While the example of using the two-phase DLL circuit has been explained in the above embodiment, the present invention is not limited thereto, and the invention can be also applied to an n-phase DLL circuit, where n is a power of 2.

What is claimed is:

1. A semiconductor memory device having a duty detection circuit, the duty detection circuit comprising:
    first and second discharge transistors that operate in response to first and second control signals;
    first and second charge transistors that operate in response to third and fourth control signals;
    a first detection line connected to a contact node between the first discharge transistor and the first charge transistor;
    a second detection line connected to a contact node between the second discharge transistor and the second charge transistor;
    a comparator circuit that detects a potential difference between the first and second detection lines;
    a first gate circuit that can activate the first control signal when an internal clock signal being at a high level during every n cycles (where n is a power of 2) of an internal clock signal;
    a second gate circuit that can activate the second control signal when the internal clock signal being at a low level during every n cycles of the internal clock signal;
    a third gate circuit that can activate the third control signal when the internal clock signal being at the low level during every n cycles of the internal clock signal;
    a fourth gate circuit that can activate the fourth control signal when the internal clock signal being at the high level during every n cycles of the internal clock signal;
    a first delay circuit that delays one of the first and second control signals; and
    a second delay circuit that delays one of the third and fourth control signals.

2. The semiconductor memory device as claimed in claim 1, wherein delay amounts of the first and second delay circuits are at least a half cycle of the internal clock signal.

3. The semiconductor memory device as claimed in claim 1, wherein the duty detection circuit further comprises a precharge circuit that precharges the first and second detection lines to an intermediate potential.

4. The semiconductor memory device as claimed in claim 1, wherein
    the first gate circuit receives the internal clock signal and a first selection signal, and generates the first control signal,
    the second gate circuit receives an inverted signal of the internal clock signal and a second selection signal, and generates the second control signal,
    the third gate circuit receives the inverted signal and a third selection signal, and generates the third control signal, and
    the fourth gate circuit receives the internal clock signal and a fourth selection signal, and generates the fourth control signal.

5. The semiconductor memory device as claimed in claim 1, wherein numbers of the first to fourth control signals that active corresponding each detection period are mutually equal.

6. The semiconductor memory device as claimed in claim 5, wherein
during a first detection period, three control signals excluding any one of the first to fourth control signals are activated,
during a second detection period, three control signals excluding any other one of the first to fourth control signals are activated,
during a third detection period, three control signals excluding still any other one of the first to fourth control signals are activated, and
during a fourth detection period, three control signals excluding a remaining one of the first to fourth control signals are activated.

7. The semiconductor memory device as claimed in claim 6, wherein
during the first detection period, the first, second, and third control signals are activated,
during the second detection period, the first, second, and fourth control signals are activated,
during the third detection period, the second, third, and fourth control signals are activated, and
during the fourth detection period, the first, third, and fourth control signals are activated.

8. The semiconductor memory device as claimed in claim 1, further having a DLL circuit, wherein the DLL circuit comprises:
a frequency-dividing circuit that generates n (where n is a power of 2) frequency-divided signals of which phases are mutually different, by dividing the frequency of an external clock signal into n;
n delay adjusting units that adjust the phases of the frequency-divided signals;
a combining circuit that generates an internal clock signal by combining outputs from the n delay adjusting units; and
the duty detection circuit that detects a duty of the internal clock signal, and an output signal of the duty detection circuit is fed back to at least one of the n delay adjusting units.

9. The semiconductor memory device as claimed in claim 8, wherein
n=2,
two duty detection circuits are employed,
one of the duty detection circuits detects corresponding to an even cycle of the internal clock signal,
the other duty detection circuit detects corresponding to an odd cycle of the internal clock signal, and
the delay adjusting unit adjusts an edge of the even cycle of the internal clock signal based on an output signal of one of the duty detection circuits, and adjusts an edge of the odd cycle of the internal clock signal based on an output signal of the other duty detection circuit.

10. A data processing system comprising a data processor and a semiconductor memory device coupled to the data processor, wherein the semiconductor memory device including a duty detection circuit, the duty detection circuit comprising:
first and second discharge transistors that operate in response to first and second control signals;
first and second charge transistors that operate in response to third and fourth control signals;
a first detection line connected to a contact node between the first discharge transistor and the first charge transistor;
a second detection line connected to a contact node between the second discharge transistor and the second charge transistor;
a comparator circuit that detects a potential difference between the first and second detection lines;
a first gate circuit that can activate the first control signal when an internal clock signal being at a high level during every n cycles (where n is a power of 2) of an internal clock signal;
a second gate circuit that can activate the second control signal when the internal clock signal being at a low level during every n cycles of the internal clock signal;
a third gate circuit that can activate the third control signal when the internal clock signal being at the low level during every n cycles of the internal clock signal;
a fourth gate circuit that can activate the fourth control signal when the internal clock signal being at the high level during every n cycles of the internal clock signal;
a first delay circuit that delays one of the first and second control signals; and
a second delay circuit that delays one of the third and fourth control signals.

11. The data processing system as claimed in claim 10, wherein delay amounts of the first and second delay circuits are at least a half cycle of the internal clock signal.

12. The data processing system as claimed in claim 10, wherein the duty detection circuit further comprises a precharge circuit that precharges the first and second detection lines to an intermediate potential.

13. The data processing system as claimed in claim 10, wherein
the first gate circuit receives the internal clock signal and a first selection signal, and generates the first control signal,
the second gate circuit receives an inverted signal of the internal clock signal and a second selection signal, and generates the second control signal,
the third gate circuit receives the inverted signal and a third selection signal, and generates the third control signal, and
the fourth gate circuit receives the internal clock signal and a fourth selection signal, and generates the fourth control signal.

14. The data processing system as claimed in claim 10, wherein numbers of the first to fourth control signals that active corresponding each detection period are mutually equal.

15. The data processing system as claimed in claim 14, wherein
during a first detection period, three control signals excluding any one of the first to fourth control signals are activated,
during a second detection period, three control signals excluding any other one of the first to fourth control signals are activated,
during a third detection period, three control signals excluding still any other one of the first to fourth control signals are activated, and
during a fourth detection period, three control signals excluding a remaining one of the first to fourth control signals are activated.

16. The data processing system as claimed in claim 15, wherein during the first detection period, the first, second, and third control signals are activated, during the second detection period, the first, second, and fourth control signals are activated, during the third detection period, the second, third, and fourth control signals are activated, and during the fourth detection period, the first, third, and fourth control signals are activated.

17. The data processing system as claimed in claim 10, wherein the semiconductor memory device further including a DLL circuit, wherein the DLL circuit comprises:

a frequency-dividing circuit that generates n (where n is a power of 2) frequency-divided signals of which phases are mutually different, by dividing the frequency of an external clock signal into n;

n delay adjusting units that adjust the phases of the frequency-divided signals;

a combining circuit that generates an internal clock signal by combining outputs from the n delay adjusting units; and the duty detection circuit that detects a duty of the internal clock signal, and an output signal of the duty detection circuit is fed back to at least one of the n delay adjusting units.

18. The data processing system as claimed in claim 17, wherein n=2, two duty detection circuits are employed, one of the duty detection circuits detects corresponding to an even cycle of the internal clock signal, the other duty detection circuit detects corresponding to an odd cycle of the internal clock signal, and the delay adjusting unit adjusts an edge of the even cycle of the internal clock signal based on an output signal of one of the duty detection circuits, and adjusts an edge of the odd cycle of the internal clock signal based on an output signal of the other duty detection circuit.

* * * * *